United States Patent
Muecke et al.

(10) Patent No.: US 9,910,123 B2
(45) Date of Patent: Mar. 6, 2018

(54) CALIBRATION MODULE FOR A TESTER AND TESTER

(71) Applicant: Advantest Corporation, Tokyo (JP)

(72) Inventors: Martin Muecke, Stuttgart (DE); Sandra-Christine Fricke, Boeblingen (DE); Jonas Horst, Fichtenberg (DE)

(73) Assignee: Advantest Corporation, Tokyo (JP)

( * ) Notice: Subject to any disclaimer, the term of this patent is extended or adjusted under 35 U.S.C. 154(b) by 219 days.

(21) Appl. No.: 14/738,916

(22) Filed: Jun. 14, 2015

(65) Prior Publication Data
US 2015/0285892 A1    Oct. 8, 2015

Related U.S. Application Data

(63) Continuation of application No. 13/925,771, filed on Jun. 24, 2013, now Pat. No. 9,121,881, which is a continuation-in-part of application No. PCT/EP2010/070503, filed on Dec. 22, 2010.

(51) Int. Cl.
*G01R 1/02* (2006.01)
*G01R 35/00* (2006.01)
*G01R 31/00* (2006.01)
*G01R 31/319* (2006.01)

(52) U.S. Cl.
CPC ....... *G01R 35/005* (2013.01); *G01R 31/3191* (2013.01)

(58) Field of Classification Search
CPC ............ G01R 31/3191; G01R 31/2889; G01R 31/2896; G01R 31/3167; G01R 31/3193; G01R 35/005
See application file for complete search history.

(56) References Cited

U.S. PATENT DOCUMENTS

| | | | |
|---|---|---|---|
| 5,929,628 A | 7/1999 | Becker et al. | |
| 6,066,953 A * | 5/2000 | Wadell | G01R 31/3167 324/601 |
| 6,300,757 B1 | 10/2001 | Janssen | |
| 6,847,212 B1 * | 1/2005 | Muhitch | G01R 31/001 324/511 |
| 7,061,227 B2 | 6/2006 | Bucksch et al. | |

(Continued)

FOREIGN PATENT DOCUMENTS

WO    WO 2012084028 A1 *  6/2012  ......... G01R 31/3191

*Primary Examiner* — Minh N Tang

(57) ABSTRACT

A calibration module for a tester, for testing a device under test, includes a pair of RF-channel terminals, a calibration device, a pair of measurement terminals and a mode selector. The pair of RF-channels terminals is configured to send or receive measurement signals to or from an RF-channel of the tester. The calibration device is configured to perform a calibration of the RF-channel based on the measurement signals sent to, or received from, the RF-channel. The pair of measurement terminals is configured to send or receive measurement signals to or from the device under test. The mode selector is configured to connect, in a calibration phase, the pair or RF-channel terminals to the calibration device for calibrating the RF-channel and to connect, in a measurement phase, the pair of RF-channel terminals to the pair of measurement terminals for routing measurement signals from the RF-channel to the device under test or vice versa.

11 Claims, 5 Drawing Sheets

(56) References Cited

U.S. PATENT DOCUMENTS

| | | | |
|---|---|---|---|
| 7,180,314 B1* | 2/2007 | Sekel | G01R 1/06766 324/130 |
| 8,138,778 B1* | 3/2012 | Smith | G01R 31/2808 324/756.02 |
| 2005/0046436 A1* | 3/2005 | Frankowsky | G01R 31/3191 324/750.02 |
| 2006/0146318 A1 | 7/2006 | Adam et al. | |

* cited by examiner

CALIBRATION MODULE FOR A TESTER AND TESTER

CROSS-REFERENCE TO RELATED APPLICATIONS

This application is a continuation of U.S. patent application Ser. No. 13/925,771 filed Jun. 24, 2013, now U.S. Pat. No. 9,121,881, which is a continuation-in-part of International Application No. PCT/EP2010/070503, filed Dec. 22, 2010, both which are incorporated herein by reference in their entirety.

BACKGROUND OF THE INVENTION

Embodiments of the present invention create a calibration module for a tester, which can be used to calibrate an RF-part of the tester. Further embodiments of the present invention create a tester with an exchangeable calibration module.

RF sources and RF receivers in an automated test equipment (ATE) provide RF resources at connection pins to the device under test (DUT) interface. To achieve calibrated power level and enable scalar and vector (=s-parameter) measurements a per-pin-calibration is necessitated. This is done either by an external calibration kit or calibration robot which can connect to all RF pins and routes the pin to measurement devices for transmit signals and provides a loop-back to a receiver input.

As a typical calibration kit has only one measurement capability connectable to one input, all RF pins have to be calibrated one after the other. This leads to long calibration times and hence downtime of the ATE. One pin necessitates a calibration time in the range of minutes. A potential ATE-System with several hundred pins would necessitate many hours.

SUMMARY

According to an embodiment, an exchangeable calibration module for a tester for testing a device under test may have: a pair of RF-channel terminals including a first RF-channel terminal and a second RF-channel terminal, wherein the pair of RF-channel terminals is configured to send or receive measurement signals to or from an RF-channel of the tester; a calibration device configured to perform, a calibration of the RF-channel based on the measurement signals sent to, or received from the RF-channel; a pair of measurement terminals including a first measurement and a second measurement terminal, wherein the pair of measurement terminals is configured to send or receive measurement signals to or from the device under test; a mode selector configured to connect, in a calibration phase, the pair of RF-channel terminals to the calibration device for calibrating the RF-channel and to connect, in a measurement phase, the pair of RF-channel terminals to the pair of measurement terminals for routing measurement signals from the RF-channel to the device under test, or for routing measurement signals from the device under test to the RF-channel; and wherein the first RF channel terminal is a cable connector and the second RF channel terminal is a cable connector.

According to another embodiment, a tester for communicating with a device under test may have: an RF-channel; and an inventive exchangeable calibration module, configured to send or receive measurement signals to or from the RF-channel, wherein the calibration module is configured to route, in the measurement phase, measurement signals from the RF-channel to the device under test or to route, in the measurement phase, measurement signals from the device under test to the RF-channel.

Embodiments of the present invention create a calibration module for a tester, testing a device under test. The calibration module comprises a pair of RF-channel terminals comprising a first RF-channel terminal and a second RF-channel terminal, wherein the pair of RF-channel terminals is configured to send or receive measurement signals to or from an RF-channel of the tester. The RF-channel may comprise an RF transmit port for transmitting measurement signals to the pair of RF-channel terminals and may comprise an RF receive port for receiving measurement signals sent from the pair of RF-channel terminals.

The calibration module farther comprises a calibration device, configured to perform, (or support) a calibration of the RF-channel based on the measurement signals sent to, or received from the RF-channel.

The calibration module further comprises a pair of measurement terminals comprising a first measurement terminal and a second measurement terminal, wherein the pair of measurement terminals is configured to send or receive measurement signals to or from the device under test.

The calibration module further comprises a mode selector to connect, in a calibration phase the pair of RF-channels to the calibration device for calibrating the RF-channels and to connect, in a measurement phase, the pair of RF-channel terminals to the pair of measurement terminals for routing measurement signals from the RF-channel to the device under test and/or for routing measurement signals from the device under test to the RF-channel.

It is the key idea of the embodiments of the present invention that a faster calibration of an RF part of a tester can be achieved if the RF part of the tester is separated into parts, which can be calibrated separately from each other. In embodiments of the present invention, a RF part of the tester is separated into the RF-channel and into the calibration device. The RF-channel can be calibrated using the calibration device, therefore no additional calibration kit or calibration robot is necessitated for calibrating the RF-channel. Furthermore, the calibration of the calibration modules can be calibrated separately on the RF-channel of the tester (e.g. outside the tester) confirming all ports and paths received concerning all signal paths between the pair of RF-channel terminals and the pair of measurement terminals.

By providing the calibration device in the calibration module, the interior part of the RF-channel can be calibrated, so the complete path up to the device under test connector (the pair of measurement terminals) of a tester can be computed. The calibration module may be, for example, exchangeable from the tester and may be pre-calibrated and recalibrated in a factory of the manufacturer of the calibration module. In contrast to this, the RF-channel of the tester can be calibrated at the customer site using the calibration module. The calibration of the RF part of a very complex tester or a very complex automated test equipment can therefore be performed within a downtime of minutes instead of hours.

It is an advantage of embodiments of the present invention that a faster recalibration of an RF part of a tester can be achieved.

In the measurement phase, the calibration module may only be used for routing the measurement signals from the RF-channels to the device under test and the calibration device may be deactivated. Therefore, in the measurement phase, the calibration module may only provide passive signal paths from the RF-channel to the device under test, with no influence on the measurement signals routed from the RF-channel to the device under test and from the device under test to the RF-channel. In the measurement phase, the tester, to which the calibration module is connected, is therefore, testing the device under test.

In the calibration phase, the calibration module may act as an active device providing calibration functions for the RF-channel.

According to some embodiments, the calibration device may perform the calibration of the RF-channel by providing a loopback function, sensing a power of a measurement signal received at the RF-channel terminals or by providing a stimulus as a measurement signal at an RF-channel terminal. Therefore, the calibration device may perform a calibration by providing a calibration environment for the RF-channel. The calibration module can furthermore transmit calibration results (e.g. a sensed power of a measurement signal) to the RF-channel.

According to some embodiments, the calibration module may comprise a calibration memory holding calibration values for possible signal paths between the pair of RF-channel terminals and the pair of measurement terminals. The calibration value may comprise transfer functions, for example s-parameter for all ports (for all measurement terminals) of the calibration module. These calibration values may be determined during a manufacturing process of the calibration module by the manufacturer of the calibration module and may be stored into the calibration memory. Furthermore, the calibration values may be recalibrated in certain time spans, for example, at the manufacturer. Therefore, no calibration of the calibration module at the customer site is necessitated. The calibration module may only comprise passive components between an RF-channel terminal and a measurement terminal, with a calibration of a signal path between the RF-channel terminals and the measurement terminals having a higher validity than a calibration of an RF-channel (comprising active components). With this, the calibration of the calibration module, respectively of the signal paths of the calibration module may be repeated in longer time intervals than the calibration of the RF-channel of the tester. Therefore, the calibration of the RF-channels may be performed more often than the calibration of the calibration module. Therefore, it is advantageous that the calibration of the RF-channels, which necessitates a shorter calibration interval, can happen at the customer site, wherein the calibration of the calibration module, which has longer calibration intervals, can be done at the manufacturer site.

According to further embodiments, the calibration module may comprise a plurality of measurement terminals. Therefore, a calibration of the calibration module may be time consuming, as every measurement terminal of the calibration module may have to be calibrated. Embodiments solve this problem by providing the exchangeable calibration module, this enables a calibration of the calibration module outside the tester (e.g. at a manufacturer side). During the time of the calibration of the calibration module, the tester may continue running using a replaced (freshly calibrated) calibration module. This concept reduces a downtime of the automatic test equipment or of the tester on-site by using the precalibrated calibration modules.

The calibration values stored in the calibration memory can be used by the tester for calculating the channel properties (of the measurement terminals) in conjunction with the obtained calibration values for the RF-channel by using the calibration module.

In other words, embodiments of the present invention provide a concept in which features of a calibration kit or calibration robot are integrated into an (exchangeable) calibration module, which can be easily accessed. This calibration module may contain calibrated standards to perform a channel-based calibration and calibration data, e.g. s-parameters for all ports, which can be used for system calibration and provide calibration including the connection pins (the measurement terminals) to a device under test interface (e.g. connected to the device under test). This data (the calibration values) can be stored inside the exchangeable calibration module (e.g. in a calibration memory of the calibration module).

According to further embodiments, the calibration module may comprise a plurality of pairs of RF-channel terminals, wherein each pair of RF-channel terminals is configured to communicate with a different RF-channel of a tester. Furthermore, such a calibration module may comprise a plurality of calibration devices and mode selectors, each associated to a pair of RF-channel terminals. Furthermore, such a calibration module may comprise a plurality of pairs of measurement terminals, each pair of measurement terminals being associated to a pair of RF-channel terminals.

In other words, the channel count of a calibration module according to an embodiment corresponds to the channel count of the frontend card (of the card in the tester holding the plurality of RF-channels). If this card contains four RxTx-channels (four RF-channels), the exchangeable modules may contain eight input pins (8 RF-channel terminals or 4 pairs of RF-channel terminals).

Further embodiments of the present invention provide a tester or an automatic test equipment, for communicating with a device under test (or for testing the device under test). The tester comprises an RF-channel (or a plurality of RF-channels), and an exchangeable calibration module as it was described above, which is configured to send or receive measurement signals to or from the RF-channel. The calibration module is configured to route, in the measurement phase, measurement signals from the RF-channel to the device under test, or to route the measurement signals from the device under test to the RF-channels.

Furthermore, the calibration module is configured to provide a calibration for the RF-channel of the tester. By having the exchangeable calibration module, it can be achieved that the RF part of the tester, consisting of the RF-channel and the exchangeable calibration module, can be separated and can be separately calibrated, wherein the active components (the RF-channels) can be calibrated more often at the customer site, and the passive components (the calibration module) can be calibrated less often at the manufacturer site. This reduces the downtime of the tester for calibration.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
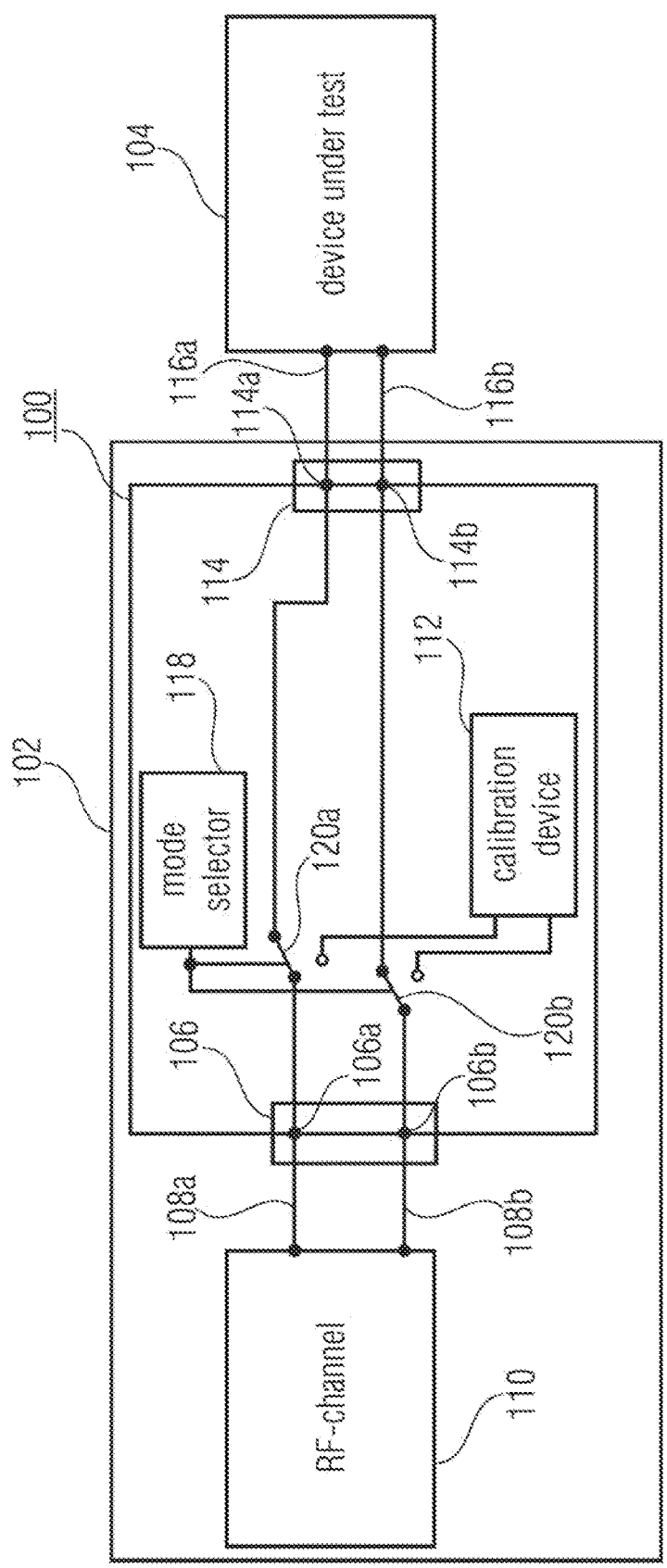
FIG. 1 shows a block schematic diagram of a calibration module embedded in a tester, according to an embodiment.

Before embodiments of the present invention are described in detail using the accompanying figures, it is to be pointed out that the same elements or elements with the same function will be provided with the same reference numerals and that a description of elements provided with the same reference numerals is mutually exchangeable. Therefore, a repeated description of elements provided with the same reference numerals is omitted.

FIG. 1 shows a block schematic diagram of a calibration module 100 for a tester 102 for testing a device under test 104. In FIG. 1 the calibration module 100 is shown as a component of the tester 102. The calibration module 100 may, for example, be an exchangeable component of the tester 102, which means that the calibration module 100 may be detachable from the tester 102. Therefore, the calibration module 100 may be an exchangeable card or part of the tester 102.

The calibration module 100 comprises a pair of 106 RF-channel terminals comprising a first RF-channel terminal 106a and a second RF-channel terminal 106b. The pair 106 of RF-channel terminals is configured to send or receive measurement signals 108a, 108b to or from an RF-channel 110 of the tester 102. For example, the first RF-channel terminal 106a may be configured to receive a measurement signal 108a from the RF-channel 110 and the second RF-channel terminal 106b may be configured to transmit a measurement signal 108b to the RF-channel 110.

The calibration module 100 comprises a calibration device 112 which is configured to perform a calibration of the RF-channel 110 based on the measurement signals 108a, 108b sent to, or received from, the RF-channel 110.

The calibration module 100 further comprises a pair 114 of measurement terminals comprising a first measurement terminal 114a and a second, measurement terminal 114b. The pair 114 of measurement terminals is configured to send or receive measurement signals 116a, 116b to or from the device under test 104. For example, the first measurement terminal 114a may be configured to send a measurement signal 116a to the device under test 104 and the second measurement terminal 114b may be configured to receive a measurement signal 116b from the device under test 104.

The calibration module 100 further comprises a mode selector 118 configured to connect, in a calibration phase, the pair 106 of RF-channels to the calibration device 112 for calibrating the RF-channel 110. The mode selector 118 is configured to connect, in a measurement phase, the pair 106 of RF-channel terminals to the pair 114 of measurement terminals for routing measurement signals from the RF-channel 110 to the device under test 104, or for routing measurement signals from the device under test 104 to the RF-channel 110. For example, the mode selector 118 may connect the first RF-channel terminal 106a to the first measurement terminal 114a for routing the measurement signal 108a to the device under test 104, such that the measurement signal 108a corresponds to the measurement signal 116a (or in other words, such that the measurement signal 108a is the measurement signal 116a). Furthermore, the mode selector 118 may connect the second RF-channel terminal 106b to the second measurement terminal 114b for routing the measurement signal 116b from the device under test 104 to the RF-channel 110, such that the measurement signal 116b corresponds to the measurement signal 108b (or in other words, such that the measurement signal 116b is the measurement signal 108b).

In other words, the mode selector 118 is configured to establish signal paths between the pair 106 of RF-channel terminals and the pair 114 of measurement terminals. The mode selector 118 as shown in FIG. 1 may establish a signal path between the first RF-channel terminal 106a and the first measurement terminal 114a, and may establish another signal path between the second RF-channel terminal 106b and the second measurement terminal 114b.

The mode selector 118 may control a first switch 120a for establishing the signal path between the first RF-channel terminal 106a and the first measurement terminal 114a, and for connecting the first RF-channel terminal 106a to the calibration device 112. The mode selector 118 may further control a second switch 120b for establishing the signal path between the second RF-channel terminal 106b and the second measurement terminal 114b, and for connecting the second RF-channel terminal 106b to the calibration device 112.

The switches 120a, 120b may be implemented using switching transistors or relays or PIN diodes.

The established signal path between the pair 106 of RF-channels and the pair 114 of measurement terminal may comprise passive components (such as transistors, capacitors, inductors or signal paths of switches, such as drain-source-paths or emitter-collector-paths).

This means the measurement signals routed from the RF-channel 110 to the device under test 104, or from the device under test 104 to the RF-channel 110 may be routed only along passive components. In contrast to this, the RF-channel 110 may comprise active components such as amplifiers or signal generators, which have to be calibrated more often than the passive components of the calibration module 100. Therefore, a calibration of the RF-channel 110 may be necessitated more often than a calibration of the calibration module 100. Therefore, the calibration module 100 enables a separate calibration of the RF-channel 110 and the calibration module 100. Therefore, the RF-channel 110 may be calibrated using the calibration module 100 at the customer site, which means that the calibration module 100 remains in the tester 102 during calibration of the RF-channel 110. For calibrating the calibration module 100, the calibration module 100 can be removed from the tester 102 and can be replaced with another (freshly calibrated) calibration module, for example, having the same functions as the calibration module 100. The removed calibration module 100 may be sent to the manufacturer of the calibration module 100 for calibrating itself for calibrating the calibration module 100 at the manufacturer site.

As can be seen from FIG. 1, the mode selector 118 may be configured to disconnect the pair 106 of RF-channel terminals from the calibration device 112 in the measurement phase, such that the calibration device 112 does not influence a measurement perforated on the device under test 104. In the example shown in FIG. 1, the calibration module 100 is in the measurement phase, meaning that the switches 120a, 120b connect the pair 106 of RF-channels to the pair 114 of measurement terminals and the calibration device 112 is disconnected from the pair 106 of RF-channels.

Furthermore, the mode selector 118 may be configured to disconnect the pair 114 of measurement terminals (by switching the switches 120a, 120b) from the pair 106 of RF-channel terminals in the calibration phase, such that the calibration of the RF-channel 110 is not influenced by the pair 114 of measurement channels and the connected device under test 104.

Figure 2A:
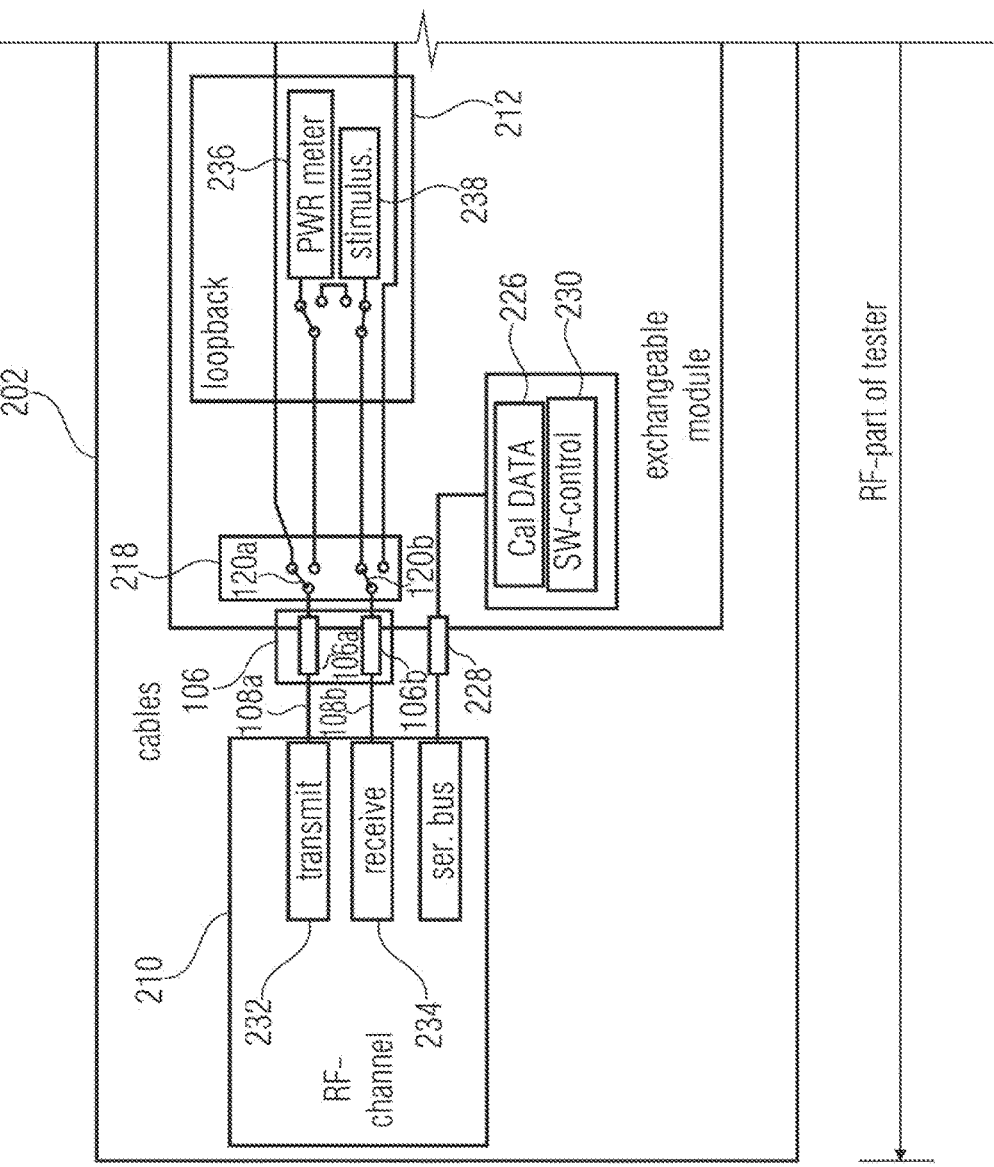
FIGS. 2A-2B shows a block schematic diagram of a calibration module embedded in a tester, according to a further embodiment.
Figure 2B:
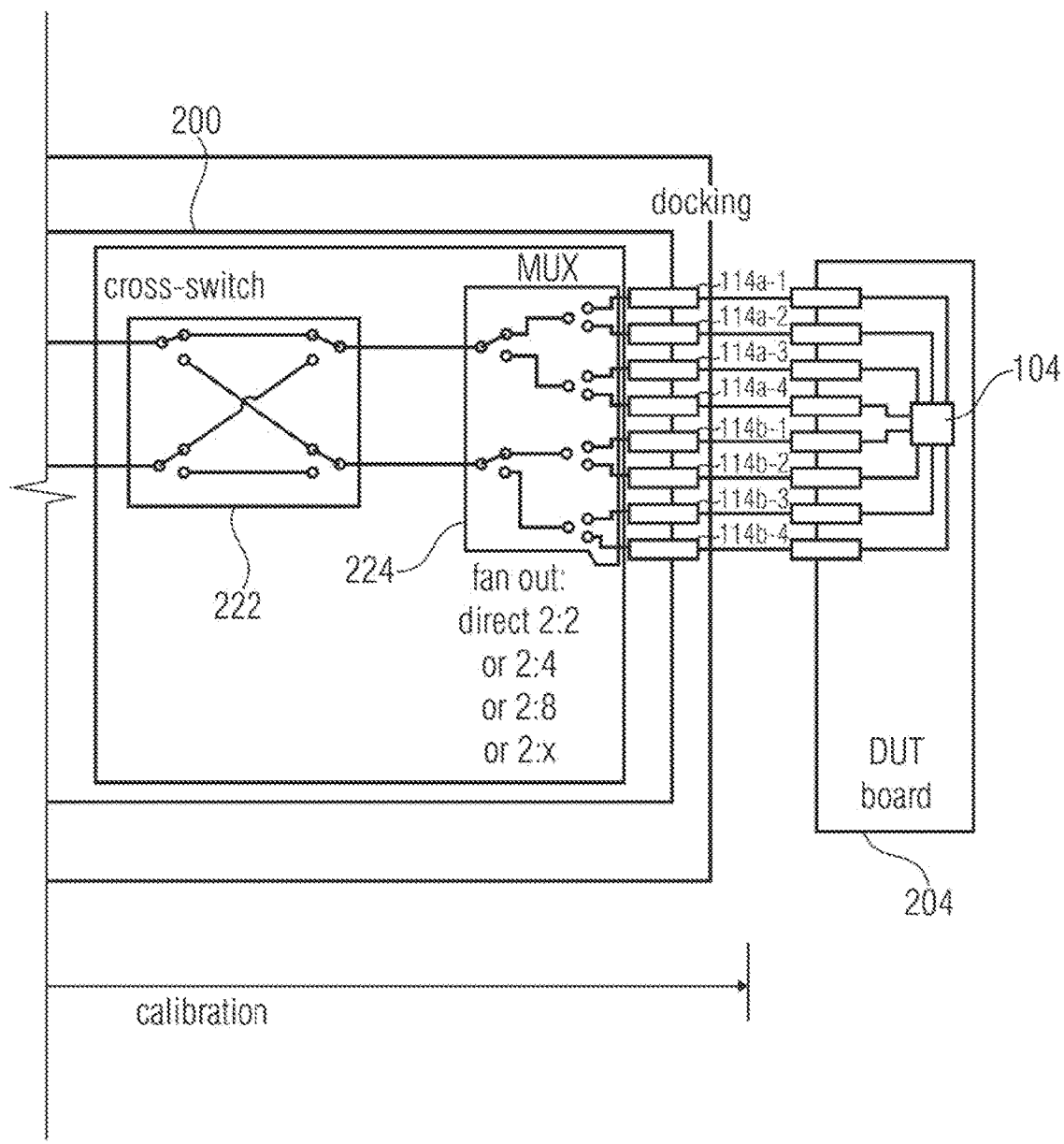

FIG. 2 shows a block schematic diagram of a calibration module 200 for a tester 202 for testing a device under test 104. In the example shown in FIG. 1, the calibration module 200 is embedded in the tester 202 and is connected to an RF-channel 210 of the tester 202. The calibration module 200 may, in its functionality, be equal to the calibration module 100 and may comprise the additional features shown in FIG. 2. Furthermore, the RF-channel 210 may, it its functionality, be equal to the RF-channel 110 of the tester 102.

The calibration module 200 differs from the calibration module 100 in that it comprises a plurality of measurement terminals 114a-1 to 114a-4, 114b-1 to 114b-4. The plurality of measurement terminals 114a-1 to 114a-4, 114b-1 to 114b-4 can be separated in a first group of measurement terminals 114a-1 to 114a-4 and a second group of measurement terminals 114b-1 to 114b-4. The second group of measurement terminals 114b-1 to 114b-4 and the first group of measurement terminals 114a-1 to 114a-4 are disjunct. The calibration device 200 further comprises a mode selector 218, a functionality of which is similar to a functionality of the mode selector 118 from the calibration module 100. The functionality of the mode selector 218 is different from the functionality of the mode selector 118 in that it may handle a higher number of measurement terminals of the calibration module 200, compared to the calibration module 100. Therefore, the mode selector 218 provides a higher flexibility in routing measurement signals from the RF-channel 210 to the device under test 104, or from the device under test 104 to the RF-channel 110. The mode selector 218 differs from the mode selector 118 in that it comprises, additionally to the switches 120a, 120b, a cross switch 222 and a multiplexer 224. The mode selector 218 may be configured to provide different signal paths between the pair 106 of RF-channels and the plurality of measurement terminals 114a-1 to 114a-4, 114a-1 to 114b-4. By using the cross switch 222 and the multiplexer 224, the mode selector 218 may be configured to connect in the measurement phase, the pair 106 of RF-channel terminals, to a chosen pair of measurement terminals out of the plurality of measurement terminals 114a-1 to 114a-4, 114b-1 to 114b-4, such that a first measurement terminal of the pair of measurement terminals which is connected to the pair 106 of RF-channel terminals is part of the first group of measurement terminals 114a-1 to 114a-4 and a second measurement terminal of the pair of measurement terminals which is connected to the pair 106 of RF-channel terminals is part of the second group of measurement terminals 114b-1 to 114b-4. The mode selector 218 may, for example, connect the first RF-channel terminal 106a to one of the measurement terminals 114a-1 to 114a-4 out of the first group of measurement terminals and may connect the second RF-channel terminal 106b to one of the measurement terminals 114b-1 to 114b-4 out of the second group of measurement terminals. This mechanism may be advantageous, for example, in the ease in which the first group of measurement terminals 114a-1 to 114a-4 are dedicated transmit terminals and the second group of measurement terminals 114b-1 to 114b-4 are dedicated receive terminals, or vice-a-versa.

The measurement terminals 114a-1 to 114a-4, 114b-1 to 114b-4 can be connected to a device under test board 204 (DUT-board 204) onto which the device under test 104 is mounted. The DUT-board 204 is therefore used to connect the device under test 104 to the tester 202 using the measurement terminals 114a-1 to 114a-4, 114b-1, to 114b-4. The device under test board 204 may be a customer- and device-specific board which can be developed by the customer who wants to test its devices.

In the example in FIG. 2 the first RF-channel terminal 106 is connected to a transmit port 232 of the RF-channel 210 and the second RF-channel terminal 106b is connected to a receive port 234 of the RF-channel 210.

According to further embodiments, the calibration module 200 may comprise a calibration memory 226 holding calibration values for possible signal paths between the pair 106 of RF-channel terminals and the measurement terminals 114a-1 to 114a-4, 114b-1 to 114b-4. In other words, the calibration memory 226 may comprise calibration values or calibration data for each measurement terminal of the measurement terminals 114a-1 to 114a-4, 114b-1 to 114b-4 of the calibration module 200. For example, the calibration memory 226 may comprise s-parameters for the signal paths between the pair 106 of RF-channel terminals and the measurement terminals 114a-1 to 114a-4, 114b-1 to 114b-4. Based on these s-parameters, characteristics (e.g. an insertion loss) of the calibration module 200 may be calculated. These calculated characteristics can be used for calculating the whole RF-part (including the RF-channel 210 and the calibration module 200) of the tester 202.

Its calibration values may be programmed into the calibration memory 226 by the manufacturer of the calibration module 200, for example, after a production of the calibration module 200. The customer using the calibration module 200 for calibrating the RF-channel 210 of the tester 202 does not need to perform a calibration of the calibration module 200, as this has already been done by the manufacturer of the calibration module 200. The tester 202 may use the calibration values for the different signal paths between the pair 106 of RF-channels and the different measurement terminals 114a-1 to 114a-4, 114b-1 to 114b-4 in conjunction with the calibration values obtained by calibrating the RF-channel 210, using the calibration module 200, for calculating the whole RF paths from the RF-channel 210 to the device under test board connector (to the measurement terminals 114a-1 to 114a-4, 114b-1 to 114b-4) or for calculating a transfer characteristic of the whole RF-part of the tester 202. If a recalibration of the calibration module 200 is needed, the calibration module 200 may be removed from the tester 202 and may be sent to the manufacturer 202 for performing a recalibration of the calibration module 200. The calibrated values of the calibration module 200 may be stored in the calibration memory 226. Therefore, there is no longer the need for a calibration kit or a calibration robot at the customer site. A removed calibration module 200 can be easily replaced by (a freshly calibrated) calibration module of the same type, thus reducing a downtime of the tester 202.

In dependence on an established signal path between the pair 106 of RF-channel terminals and the measurement terminals 114a-1 to 114a-4, 114b-1 to 114b-4 the calibration module 200 may provide a corresponding calibration value to the tester 200 for each established signal path in the measurement phase, such that the tester 200 can calculate the transfer function of the complete signal path from the generation of the measurement signals in the RF-channel 210 to the device under test 104 and vice-a-versa.

The calibration memory 226 may further comprise calibration values for the calibration device 212 of the calibration module 200. The calibration module 200 may be configured to provide the calibration values for the calibration device 212 to the RF-channel 210, or in other words, to the tester 202. These calibration values for the calibration device 212 may be used for correcting failures occurring in the calibration generated internally in the calibration device 212. The calibration module 200 may therefore be configured to provide a correction value for the calibration device 212 which can be used to minimize failures introduced by the calibration device 212.

Furthermore, the calibration memory 226 may hold a (unique) serial number associated to the calibration module 200. The serial number may be transmitted to the tester 202 for identifying the calibration 200 and for distinguishing between different calibration modules. This enables that in the case of a replacement of the calibration module the calibration values of the new calibration module are transmitted to the tester 202 for recalculating the RF-part of the tester 202 using the calibration values of the new calibration module instead of the calibration values of the calibration module which was replaced by the new calibration module.

The calibration module 200 may further comprise an information terminal 228 by which the calibration module 200 may transmit the calibration values to the RF-channel 210 or the tester 202. The information terminal 228 may further be used to receive a mode selection signal from the tester 202, based on which the mode selector 218 switches from the calibration phase to the measurement phase and from the measurement phase to the calibration phase.

As previously described, the mode selector 218 may be configured to establish different signal paths between the different measurement terminals 114a-1 to 114a-4, 114b-1 to 114b-4 of the calibration module 200 and the pair 106 of RF-channel terminals in the measurement phase. The mode selector 218 may be configured to extract an information out of the mode selection signal received from the RF-channel 210. The extracted information may define which signal paths have to be established between the pair 106 of RF-channels and the measurement terminals 114a-1 to 114a-4, 114b-1 to 114b-4, and which not, such that the mode selector 218 may, in response to the information extracted from the mode selection signal, establish the signal paths. Furthermore, the mode selector 218 may based on the extracted information out of the mode selection signal connect a certain first measurement terminal out of the plurality of measurement terminals 114a-1 to 114a-4, 114b-1 to 114b-4 to the first RF-channel terminal 106a, and may connect a certain second measurement terminal out of the plurality of measurement terminals 114a-1, to 114a-4, 114b-1 to 114b-4 to the second RF-channel terminal 106b.

In other words, the mode selector 118 may connect the pair 106 of RF-channel terminals to a pair of measurement terminals out of the plurality of measurement terminals 114a-1 to 114a-4, 114b-1 to 114b-4 based on the information extracted from the mode selection signal.

The mode selector 218 is configured to establish the signal, paths between the pair 106 of RF-channels and the measurement terminals 114a-1 to 114a-4, 114b-1 to 114b-4 by switching the switches 120a, 120b and by switching the cross switch 222 and the multiplexer 224. The selector 218 may therefore comprise a switch controller 230 configured to receive the mode selection signal and to extract the information defining which signal paths have to be established in the measurement phase and to establish the signal paths defined in the extracted information by switching the switches 120a, 120b, the cross switch 222 and the multiplexer 224.

The cross switch 222 is configured to connect in a first stage of the measurement phase, the first RF-channel terminal 106a to a first measurement terminal (e.g. to the measurement terminal 114a-1) and the second RF-channel terminal 106b to a second measurement terminal (e.g. to the measurement terminal 114b-1). In a second stage of the measurement phase the cross switch 222 may connect the first RF-channel terminal 106a to the second measurement terminal 114b-1 and the second RF-channel terminal 106b to the first measurement terminal 114a-1. In other words, the cross switch 222 is configured to swap, transmit and receive ports (TxRx paths).

Furthermore, the cross switch 222 may be configured to connect the pair 106 of RF-channel terminals to the pair of measurement terminals 114a-1, 114b-1, such that during the first stage and the second stage of the measurement phase, each measurement terminal 114a-1, 114b-1 is connected to at maximum of one RF-channel terminal 106a, 106b.

Or in other words, the cross switch 222 may be used to swap the first group of measurement terminals 114a-1 to 114a-4 with the second group of measurement terminals 114b-1 to 114b-4 such that in the first stage of the measurement phase, a measurement terminal of the first group of measurement terminals 114a-1 to 114a-4 is connected to the first RF-channel terminal 106a and a measurement terminal out of the second group of measurement terminals 114b-1 to 114-4 is connected to the second RF-channel terminal 106b and vice-a-versa in the second stage.

The multiplexer 224 is configured to connect a measurement terminal out of the first group of measurement terminals 114a-1 to 114a-4 and a measurement terminal out of the second group of measurement terminals 114b-1 to 114b-4 to the cross switch 222. The multiplexer 224 shown in FIG. 1 has a fan-out of 2:8, which means it has two input ports and eight output ports. According to further embodiments, another multiplexer comprising different fan-outs may also be used instead of the multiplexer 224.

In other words, the multiplexer 224 is configured to connect the pair 106 of RF-channel terminals to a pair of measurement terminals, such that a first measurement terminal of the first pair of measurement terminals (e.g. the measurement terminals 114a-1) is comprised in the first group of measurement terminals 114a-1 to 114a-4 and the second measurement terminals of the pair of measurement terminals (e.g. the measurement terminal 114b-1) is comprised in the second group of measurement terminals 114b-1 to 114b-4.

The calibration device 212 provides a loop back functionality for shortening the first RF-channel 106a and the second RF-channel 106b during the calibration phase. Furthermore, the calibration device 212 comprises a power meter 236, for example, to sense the power of the measurement signal 108a transmitted from the RF-channel 210.

Furthermore, the calibration device 212 provides a stimulus generator 238, for example, to generate the measurement signal 108b as a reference stimulus for the RF-channel 210.

According to another embodiment, the calibration device 212 may comprise only one, or an arbitrary combination, of the features shown in FIG. 2.

Therefore, the calibration device 212 provides different calibration functions for calibrating an interior part of the RF-channel 210, such that an external calibration kit or calibration robot for calibrating the interior part of the RF-channel 210 is no longer needed as the necessitated functions for calibrating the RF-channel 210 are integrated in the calibration module 200.

The functionality of the calibration module 200 is summarized as follows.

The concept of the present invention provides an integration of the calibration module into the TxRx channel (or into the RF part) of a tester. This system (the RF part) is separated into parts, the RF-channel 210 inside the ATE or inside the tester 202 and a separate part (the exchangeable calibration module 200) next to the device under test interface. This separate part (which is advantageously an exchangeable module) can be calibrated outside the ATE concerning all ports (alt measurement terminals) and paths (all signal paths). This calibration module 200 provides calibration devices (the power meter 236, the stimulus generator 238, and the loop back functionality or a combination of such devices) to also calibrate the interior part of the RF-channel, so that the complete path up to the device under test connector (to the measurement terminals 114a-1 to 114a-4, 114b-1 to 114b-4) can be computed. This calibration can be made simultaneously in all TxRx channels (in all RF parts of the tester 200). The principle pan of the calibration (the calibration of the calibration module 200) can be done in the factory, calibration data can be linked to the embedded RF calibration device (to the calibration module 200, for example, stored in the calibration memory 226), which can be easily exchanged at the customer site and sent back to the manufacturer for recalibration. The calibration of the RF part of a very complex ATE can be performed within a downtime of minutes instead of hours.

Embodiments integrate the features of a calibration kit or a calibration robot are integrated into an exchangeable device (into the calibration module 200), which can be easily accessed. This calibration module contains calibrated standards to perform a channel-based calibration and calibration data, e.g. s-parameters for all ports (for all measurement terminals 114a-1 to 114a-4, 114b-1 to 114b-4), which can be used for system calibration and to provide calibration, including the connection pins, to the device under test interface. This data (the calibration data or the calibration values) can be stored inside the exchangeable calibration module 200 (e.g. inside the calibration memory 226).

The channel count of the calibration module 200 corresponds to the channel count of the front-end card of the tester. If this card contains four TxRx channels, the calibration modules may contain eight input pins (e.g. four pairs of RF-channel terminals), a loop back feature, a cross switch, a power detector and a switching matrix (the multiplexer) providing a fan-out of 8, 16, 32, or even more pins. According to further embodiments, the calibration module may comprise a calibration device 212, a cross switch 222 and a multiplexer 224 for each pair 106 of RF-channel terminals that it comprises. Therefore, a parallel calibration of each RF-channel connected to the calibration module 200 can be enabled.

A customer may choose between a high performance module with few internal switches (e.g. a low fan-out multiplexer) or a low-cost system with many pins or many measurement terminals (e.g. a high fan-out multiplexer) and a significant reduction of the cost per pin.

FIG. 2 shows a part of a system level block diagram incorporating the concept of the present invention. The exchangeable calibration module provides loop-back functionality for calibration, the cross switch 222 to swap the TxRx path and the multiplexer 224 with the desired fan-out. According to a further embodiment, the cross switch 222 may also be integrated as part of the RF-channel 210 for swapping the transmit port 232 with the receive port 234.

The calibration module 200 may be connected to the RF-channel 210 using cables, for example, coaxial cables. The first RF-channel terminal 106a and the second RF terminal 106b may comprise cable connectors or may be cable connectors themselves. Furthermore, the information terminal 228 may comprise a cable connector or may be a cable connector itself. The measurement terminal 114a-1 to 114a-4, 114b-1 to 114b-4 may comprise measurement pins or measurement pads for connecting to the device under test 104 or to the device under test board 204. For example, the measurement terminals 114a-1 to 114a-4, 114b-1 to 114b-4 may comprise pogo pins for connecting the device under test board 204. The device under test board 204 may comprise corresponding pogo pins for connecting to the measurement terminals 114a-1, to 114a-4, 114b-1 to 114b-4. Therefore, the calibration module 200 may be easily exchanged from the tester 203 by disconnecting the cables between the RF-channel 210 and the calibration module 200.

Figure 3:
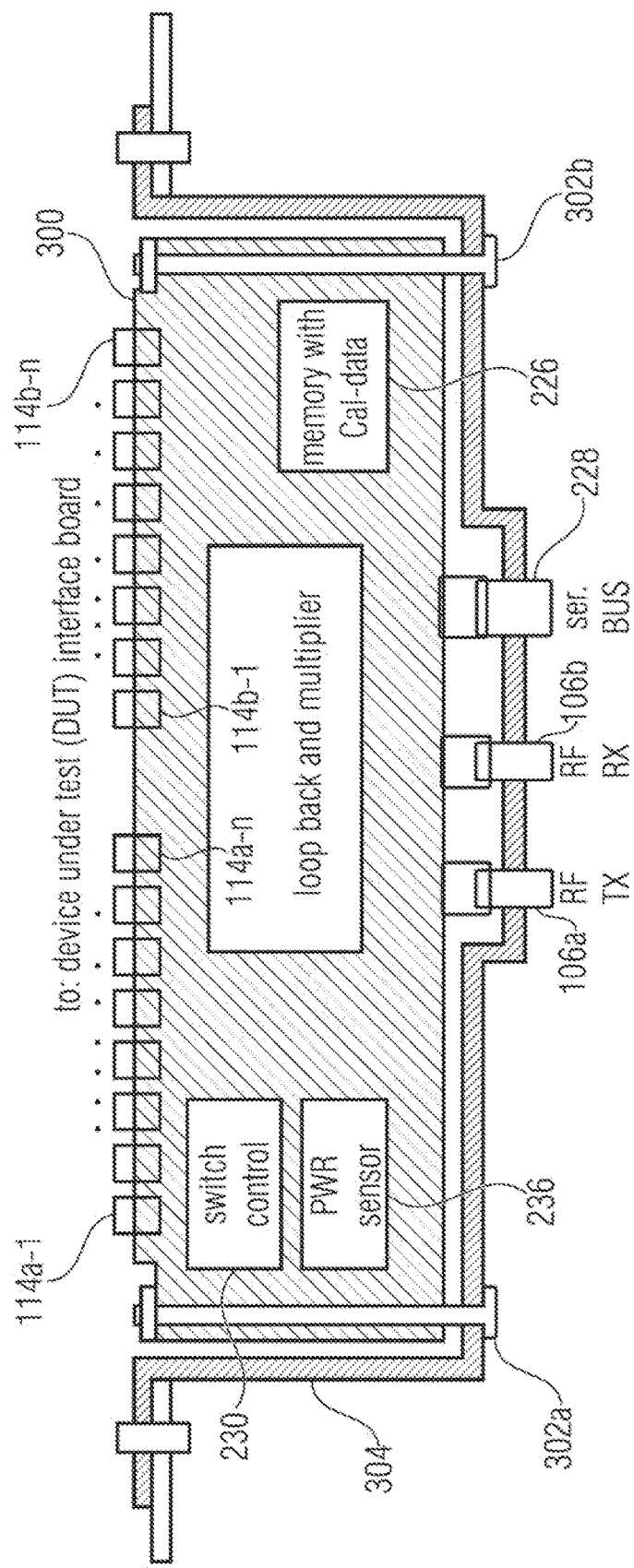
FIG. 3 shows a schematic top view on the calibration module from FIG. 2, and how it may be integrated into a tester.

FIG. 3 shows a schematic top view of a calibration module 300 according to an embodiment, which is fastened in a tester. In other words, FIG. 3 shows a schematic drawing of a calibration module 300. This calibration module 300 is accessible from the top (of the tester) and can easily be unfastened without the need for opening the tester or ATE.

As can be seen in FIG. 3, the calibration module 300 comprises cable connectors 106a, 106b, 228 (which correspond to the RF-channel terminals 106a, 106b and the information terminal 228).

In addition, the calibration module 300 comprises n measurement terminals 114a-1 to 114a-n, being associated to a first group of measurement terminals. Furthermore, the calibration module 300 comprises n measurement terminals 114b-1 to 114b-n being associated to a second group of measurement terminals. The measurement terminals 114a-1 to 114a-n, 114b-1 to 114b-n may, for example, be pogo pins for connecting to the device under test interface board 204.

According to further embodiments, the association to different groups of the measurement terminals is optional meaning that the different measurement terminals of the calibration module 300 may not necessarily be divided into disjunct groups.

Furthermore, the calibration module 300 comprises fasteners 302a, 302b for fastening the calibration module 300 in the tester. The tester may comprise a fastener 304 which is adapted to the fasteners 302a, 302b of the calibration module 300.

The mechanical solution shown in FIG. 3 consists of an easily exchangeable unit (the calibration module 300) providing the pins for docking to the DUT load board 204, including means for repeatable, reliable connections with mechanical tolerances. This module shown in FIG. 3 accommodates resources for one or more channels.

Figure 4:
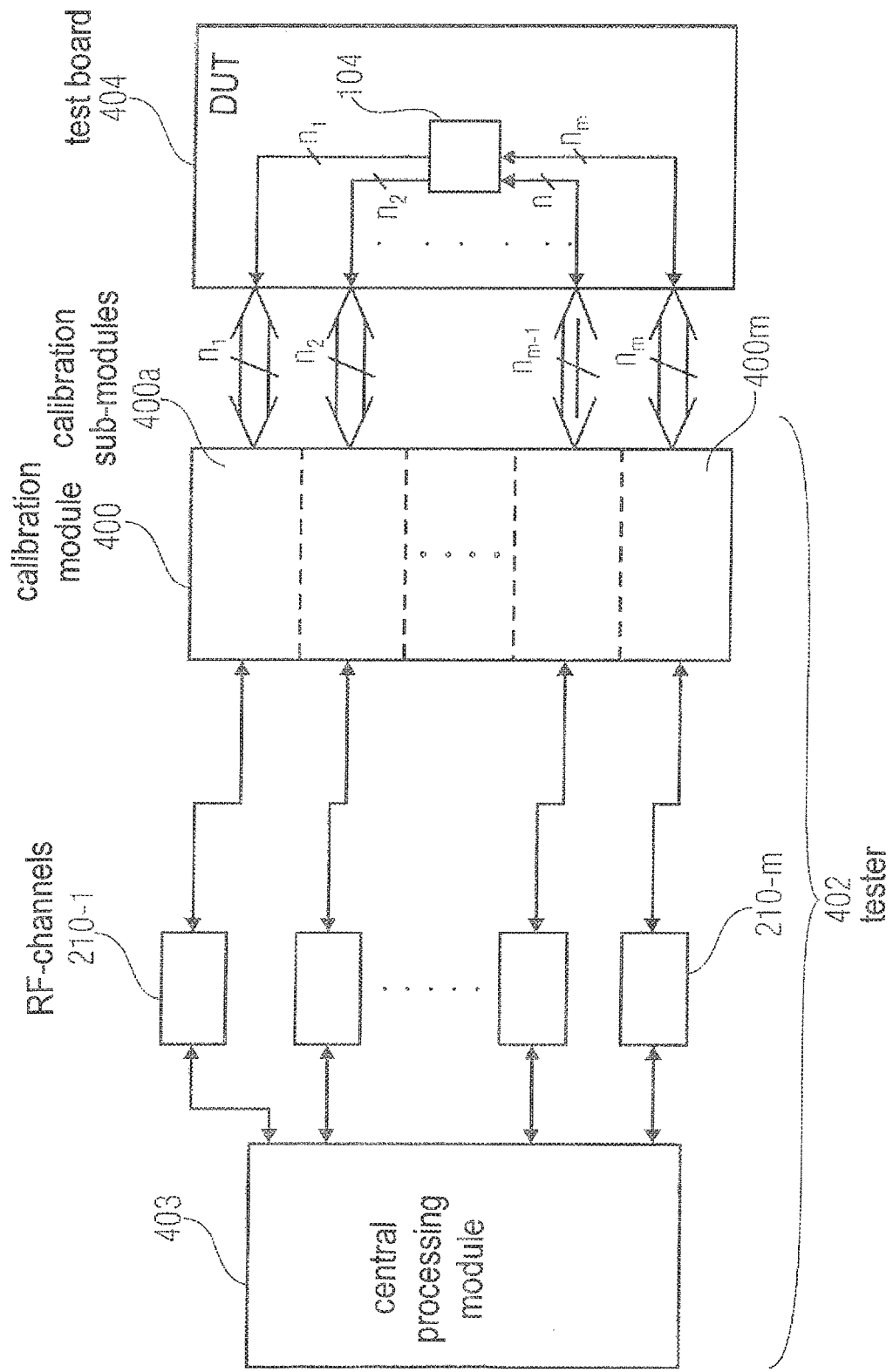
FIG. 4 shows a block schematic diagram of a tester according to an embodiment.

FIG. 4 shows a schematic block diagram of a tester 402 according to an embodiment, connected to a device under test board 404 holding a device under test 104. According to further embodiments, the device under test boards 404 may also hold a plurality of devices under test 104 which are to be tested by the tester 402.

The tester 402 comprises a calibration module 400, a functionality of which is similar to the functionality of the calibration module 200 shown in FIG. 2. The calibration module 400 differs in that it comprises a plurality of calibration sub-modules 400a to 400m, wherein each calibration sub-module 400a to 400m is connected to an RF-channel 210-1 to 210-m of the tester 402. Each calibration sub-module 400a to 400m may be similar to the calibration module 200 such that a calibration of the RF-channels 210-1 to 210-m can be simultaneously performed for all RF-channels 210-1 to 210-m. Each calibration sub-module 400a to 400m may comprise a mode selector and a calibration device which are independent from the mode selector and calibration devices of the other calibration sub-modules. Each of the calibration sub-modules 400a to 400m can be connected to its associated RF-channel 210-1 to 210-m using cables, for example, each calibration sub-module 400a to 400m may be connected to its associated RF-channel 210-1 to 210*m* using three cables (one cable per RF-channel terminal and one cable for the information terminal) for exchanging measurements signals, calibration values and the mode selection signal between the calibration sub-module and its associated RF-channel.

According to a further embodiment, the calibration module 400 may also comprise a combined information terminal or information connector for transmitting calibration values and switch mode selection signals for all of the calibration sub-modules 400*a* to 400*m*, for example, using a (serial) bus system.

The tester 402 further comprises a central processing module 403 which is configured to control the RF-channels 210-1 to 210-*m*. The central processing module 403 may be configured to calculate RF signal paths for each RF-channel 210-1 to 210-*m* and its associated calibrated sub-modules 400*a* to 400*m*, based on the calibration of the RF-channel 210-1 to 210-*m*, which can be performed using the associated calibrated sub-modules 400*a* to 400*m* and the calibration values for the associated calibration sub-modules 400*a* to 400*m*, which are stored in calibration memories of the calibration sub-module 400*a* to 400*m* on the calibration module 400.

Each calibration sub-module 400*a* to 400*m* can be connected to the device under test 204 using a plurality ($n_1$ to $n_m$) of measurement terminals, measurement pads, or measurement pins, for example, measurement pogo pins.

The tester 402 may comprise, as mentioned before, a system (e.g. a fastener) for holding the calibration module 400 inside the tester 402. The tester 402 may further comprise a holding means for holding the device under test interface board 404.

In the following, aspects and advantages of the embodiments of the present invention will be summarized.

An advantage of embodiments is that embodiments reduce an ATE downtime on site by using pre-calibrated modules (by using the calibration modules 100, 200, 400) as a calibration for an active channel (for the RF-channels 110, 210, 210-*a* to 210-*m*) and a passive output path (the signal pass established in the calibration modules) can be done separately. The channel property per pin (per measurement terminal), are calculated with this data (e.g. using the central processing module 403). It has been found that the validity time of the passive components (used in the signal path of the calibration modules) is significantly longer than of the active components (e.g. of the RF-channels). Therefore, it is an advantage of the present invention that only passive components are used in the pre-calibrated module (at least in the signal paths of the pre-calibrated calibration modules). Therefore, the parts of an RF-part of a test which have to be calibrated more often can be calibrated at the customer site using calibration modules according to embodiments. The calibration modules, which have to be calibrated less often can be pre-calibrated and recalibrated at the manufacturer site of the calibration module. Therefore, calibration robots or calibration kits are no longer necessitated at the customer site.

Another advantage is the use of the precalibrated exchangeable modules, as all ports of the exchangeable module (of the calibration modules) are characterized in the factory, and calibration data can be stored in the internal memory (in the calibration memory 226). As mentioned before, the modules (the calibration modules) can be recalibrated outside the ATE after the calibration data of these modules have expired.

Another advantage is that the calibration modules are easily exchangeable, as the modules can be mounted directly at the DUT interface, the modules can be accessed without power down of the ATE. A hot plug feature of the ATE can detect an exchange and trigger further steps. In other words, a tester, according to an embodiment may be configured to detect an exchange of a calibration module and may trigger further steps up on a detection of a new (replaced) calibration module.

Another advantage is the fast system level calibration as a calibration module can comprise calibration devices per RF-channel (such as shown in FIG. 4 with the calibration sub-module 406*a* to 460*m*). Therefore, only a little, possibly massive parallel, calibration needs to be done in the ATE, including the cables from the TxRx channel (RF-channel) to the exchangeable module.

Another advantage is the loopback capability of the exchangeable module, as no external equipment is necessitated for the calibration of the Tx and Rx cables as a loopback connection can be provided internally by the exchangeable module (by a calibration device of the exchangeable module).

A further advantage is the easy installation in the ATE, as the overall number of cables is significantly decreased by using a switching matrix (e.g. the multiplexer 224) close to the DUT board instead of inside the channel module (inside an RF-channel), which reduces the number of sensitive RF cables inside the ATE, so that thicker cables with better RF properties can be used and cabling still necessitates less space.

An even further advantage is the flexible fan-out and the cross switch 224 as the switching module (the mode selector 218) can contain a cross switch 222 and different fan-outs, for example, 1:1, 1:2, 1:3, 1:4 or even more (depending on the used multiplexer). The customer can easily change from a high-performance direct out to a "low cost per pin" fan-out (depending on the used multiplexer).

Another advantage is the direct access to the TxRx card (to the RF-channel of the tester) as the TxRx port (e.g. the transmit port 232 and the receive port 234) is/are accessible after the removal of the switching module (of the calibration module). Therefore, a direct access is possible for debugging.

Another advantage is the direct docking of the DUT at the RF ports which are directly docked to the customers DUT board (e.g. using pogo pins). No further embedding of cables between the calibration plane (the calibration module) and the load board is necessitated.

Another advantage is can be achieved by using a status indicator for indicating the calibration status of the module to a user to ease identification of modules necessitating exchange. In other words, a calibration module according to an embodiment may comprise a calibration indicator indicating its status of calibration. This indicator may, for example, show how many days are left until the next calibration of the calibration module is necessitated.

To summarize, in the embodiments the TxRx channel is separated into two parts, the first being the RF-channel inside the ATE, the second (the calibration module) as part of the device under test (DUT) interface. Both parts are connected to each other by cables.

The part of the DUT interface (the calibration module) is calibrated concerning its transfer functions and contains calibration devices to calibrate the interior part (the RF-channel). The transfer function of the complete path (of the complete RF part) can be computed and calibration is valid op to the DUT interface.

Calibration modules according to embodiments can be easily exchanged.

Embodiments provide a concept of embedding of an RF calibration into a transmit-receive (TxRx) channel and enabling significant calibration time reduction.

Some embodiments provide a calibration module wherein measurement terminals comprise measurement pins or measurement pads for connecting the measurement terminals to a device under test.

Further embodiments provide a calibration module wherein measurement terminals comprise pogo pins for connecting the measurement terminals to a device under test interface board holding a device under test.

Further embodiments provide a calibration module comprising a fastening system for fastening the calibration module in a tester.

Some embodiments provide a tester comprising a fastener for holding and fastening a calibration module inside the tester.

Further embodiments provide a tester, wherein a calibration module comprises measurement pins or measurement pads for connecting a device under test interface board to the tester, the device under test interface board holding a device under test and wherein the tester further comprises a holder for holding the device under test interface board.

Although each dependent claim is dependent on only one foregoing claim, other combinations of the claims do also form possible embodiments, except for cases in which claims are contradictory.

While this invention has been described in terms of several advantageous embodiments, there are alterations, permutations, and equivalents which fall, within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method comprising:
    coupling radio frequency channel (RF-channel) terminals, during a calibration phase, to a calibration device, wherein the RF-channel terminals are configured to send first measurement signals to an RF-channel of automatic test equipment (ATE) and are configured to receive second measurement signals from the RF-channel;
    calibrating, by the calibration device during the calibration phase, the RF-channel based on the first and second measurement signals routed between the RF-channel terminals and the calibration device, wherein said calibrating the RF-channel comprises storing a calibration value determined from calibrating the RF-channel;
    coupling the RF-channel terminals, during a measurement phase, to measurement terminals, wherein the measurement terminals are configured to send third measurement signals to a device under test (DUT) and are configured to receive fourth measurement signals from the DUT; and
    measuring, during the measurement phase, measurement signals of the first, second, third, and fourth measurement signals that are routed between the RF-channel terminals and the measurement terminals.

2. The method according to claim 1, wherein said calibrating the RF-channel further comprises calculating an RF path from the RF-channel to the DUT based upon the determined calibration value.

3. The method according to claim 1, wherein the calibration device does not influence the measurements of the first, second, third, and fourth measurement signals that are routed between the RF-channel terminals and the measurement terminals during the measurement phase.

4. The method according to claim 1, wherein the measurement terminals do not influence the calibration of the RF-channel by the calibration device during the calibration phase.

5. The method according to claim 1, wherein the DUT does not influence the calibration of the RF-channel by the calibration device during the calibration phase.

6. The method according to claim 1, wherein the calibration device is configured to loopback a measurement signal on a first RF-channel terminal to a second RF-channel terminal.

7. The method according to claim 1, wherein signal paths between the RF-channel terminals and the measurement terminals comprise passive components only.

8. The method according to claim 1, further comprising receiving a mode selection signal that causes switching between the calibration phase and the measurement phase.

9. The method according to claim 8, further comprising:
    establishing different signal paths between different measurement terminals and the RF-channel terminals in the measurement phase;
    extracting information out of the mode selection signal, the information defining which of the signal paths are to be established in the measurement phase; and
    establishing the signal paths defined by the information extracted from the mode selection signal.

10. The method according to claim 8, further comprising choosing, based on the mode selection signal, a pair of the measurement terminals for connecting to a pair of the RF-channel terminals.

11. The method according to claim 1, further comprising sensing powers of the first, second, third, and fourth measurement signals that are received at the RF-channel terminals during the calibration phase.

* * * * *